United States Patent
Yang et al.

(10) Patent No.: US 8,482,925 B2
(45) Date of Patent: Jul. 9, 2013

(54) HIGH-DENSITY COMPUTER SYSTEM

(75) Inventors: Chih-Wei Yang, New Taipei (TW); Shin-Jau Li, New Taipei (TW); Shih-Hua Huang, New Taipei (TW)

(73) Assignee: Caswell Inc., New Taipei (TW)

(*) Notice: Subject to any disclaimer, the term of this patent is extended or adjusted under 35 U.S.C. 154(b) by 131 days.

(21) Appl. No.: 13/118,062

(22) Filed: May 27, 2011

(65) Prior Publication Data

US 2011/0292589 A1 Dec. 1, 2011

(30) Foreign Application Priority Data

May 28, 2010 (TW) .................. 99210123 U

(51) Int. Cl.
*H05K 5/00* (2006.01)
*H05K 7/00* (2006.01)
*A47F 1/10* (2006.01)

(52) U.S. Cl.
USPC .. 361/727; 361/726; 361/679.58; 248/295.11

(58) Field of Classification Search
USPC ........ 361/724–727, 679.01–679.04; 248/165, 248/295.11
See application file for complete search history.

(56) References Cited

U.S. PATENT DOCUMENTS

2005/0177678 A1 8/2005 Jamp et al.
2008/0239649 A1* 10/2008 Bradicich et al. ............. 361/683

* cited by examiner

*Primary Examiner* — Zachary M Pape
*Assistant Examiner* — Jerry Wu
(74) *Attorney, Agent, or Firm* — Muncy, Geissler, Olds & Lowe, PLLC

(57) ABSTRACT

A high-density computer system comprises: a chassis, having a main backplane, and a main control circuit and a plurality of main backplane slots installed and formed on the main backplane respectively; at least one expansion card module inserted and installed in the chassis, and the expansion card module includes a sub-backplane having a sub-control circuit and a plurality of second sub-backplane slots, and an end of the sub-backplane has a first sub-backplane slot corresponding to the main backplane slot, and the first sub-backplane slot and the sub-control circuit and the second sub-backplane slots being electrically coupled; a plurality of CPU cards installed on the expansion card module, each being inserted to the second sub-backplane slot, and the CPU card having a CPU, such that the computer system can have a powerful modular assembling function to enhance the economic benefits and product competitiveness.

8 Claims, 5 Drawing Sheets

HIGH-DENSITY COMPUTER SYSTEM

BACKGROUND OF THE INVENTION

1. Field of the Invention

Figure 1:
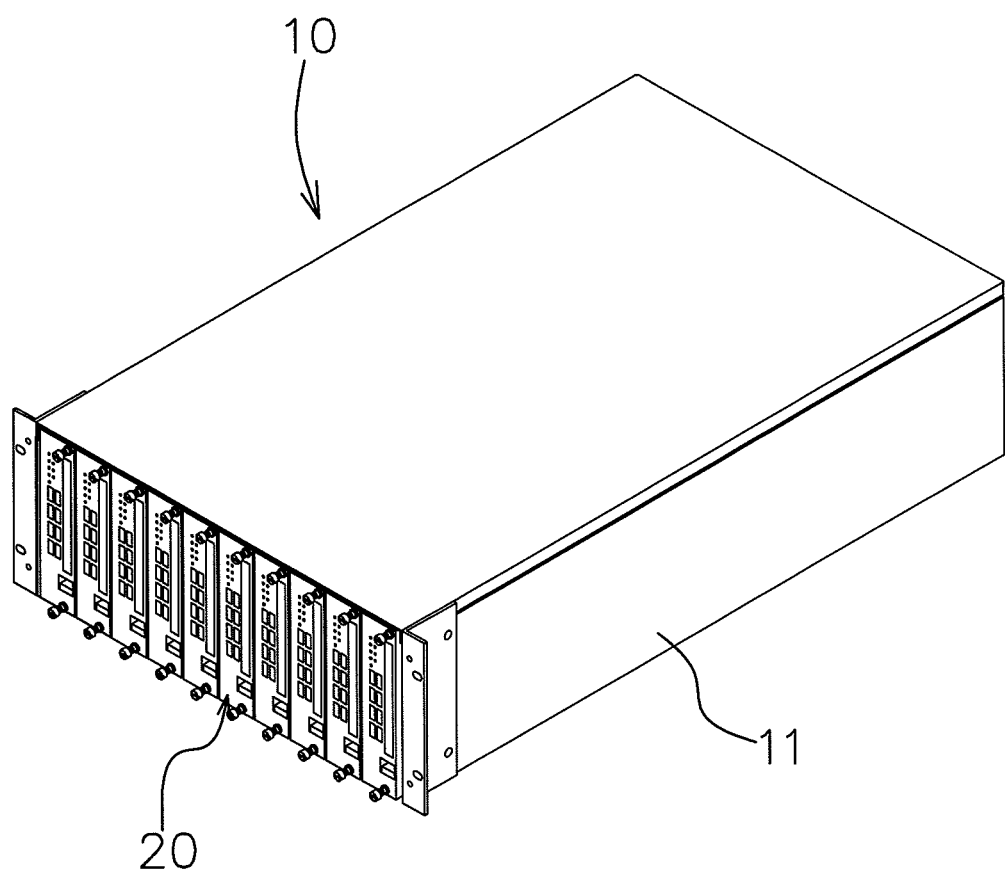

The present invention relates to a computer system, and more particularly to a high-density computer system capable of replacing, upgrading, and selecting different required modules and having excellent expandability and economic benefits.

2. Brief Description of the Related Art

Present industrial computers generally adopt a blade server with a main architecture comprising: a chassis, and a main backplane and a plurality of containing spaces in the chassis, a plurality of slots formed on the main backplane and disposed opposite to the plurality of containing spaces respectively, and a plurality of CPU cards installed in the plurality of containing spaces of the chassis respectively, and inserted and fixed into the slots of the main backplane to complete an electric connection. Although the design of the conventional blade server can meet the requirements of the industrial computer system, yet its applications still have many drawbacks. For example, the CPU card includes a central processing unit (CPU) installed thereon, but the quantity of containing spaces of the chassis is fixed, such that the upper limit of the total number of CPUs is also fixed. In the condition of having a small number of CPUs, the real-time multitasking function cannot be achieved. If it is necessary to enhance the computing function of the blade server, then the whole CPU card is replaced or upgraded, and cannot be adjusted quickly according to customer requirements. As a result, a higher cost is incurred and incompliance to economic benefits of the customers, and such arrangement is obviously not a good design. In addition, if a customer needs to add other functions or related modules such as storage, wireless, encryption/decryption, 3D image and other computer and Internet applications or modules, there will be a limitation to the module structure, and thus the whole CPU card must be replaced, and the modules cannot be changed or upgraded flexibly and conveniently. Obviously, the conventional blade server requires breakthroughs and improvements. Therefore, it is an important subject for related manufacturers and designers to overcome the drawbacks of the conventional blade server.

In view of the aforementioned drawbacks and deficiencies of the applications of the conventional blade server, the inventor of the present invention based on years of experience in the related industry to conduct extensive researches and experiments, and finally developed a high-density computer system with the real-time multitasking functions that can be upgraded conveniently or modularized flexibly to overcome the drawbacks of the prior art.

SUMMARY OF THE INVENTION

Therefore, it is a primary objective of the present invention to provide a high-density computer system with powerful modular assembling function, swappability and replaceability to provide advantages on manufacturing, assembling and flexible expansion applications, so as to enhance the economic benefits and product competitiveness.

Another objective of the present invention is to provide a high-density computer system capable of improving the containing space of the chassis to increase the number of installed CPUs, so as to achieve the real-time multitasking computing function, providing a convenient computation and a quick upgrade, and complies with the economic benefits and user requirements.

Another objective of the present invention is to provide a high-density computer system that allows a selection of different modules such as wireless modules, storage modules and related modules of other computer and Internet applications according to customer requirements, and provides a flexible replacement and allocation in a sharing architecture.

To achieve the aforementioned objectives, the present invention provides a technical measure, comprising: a chassis, having a plurality of containing spaces, a main backplane installed in the chassis, and a main control circuit and a plurality of main backplane slots installed and formed on the main backplane respectively; at least one expansion card module, inserted into the containing space, and including a sub-backplane, a sub-control circuit and a plurality of second sub-backplane slots inserted and formed on the sub-backplane respectively, and a first sub-backplane slot formed at an end of the sub-backplane and corresponding to the main backplane slot; and a plurality of CPU cards, installed onto the expansion card module, and inserted and coupled to the second sub-backplane slots respectively, and a CPU is installed on each CPU card.

The technical contents of the present invention will become apparent by the detailed description of the preferred embodiments together with the illustration of related drawings as follows:

BRIEF DESCRIPTION OF THE INVENTION

Figure 2:
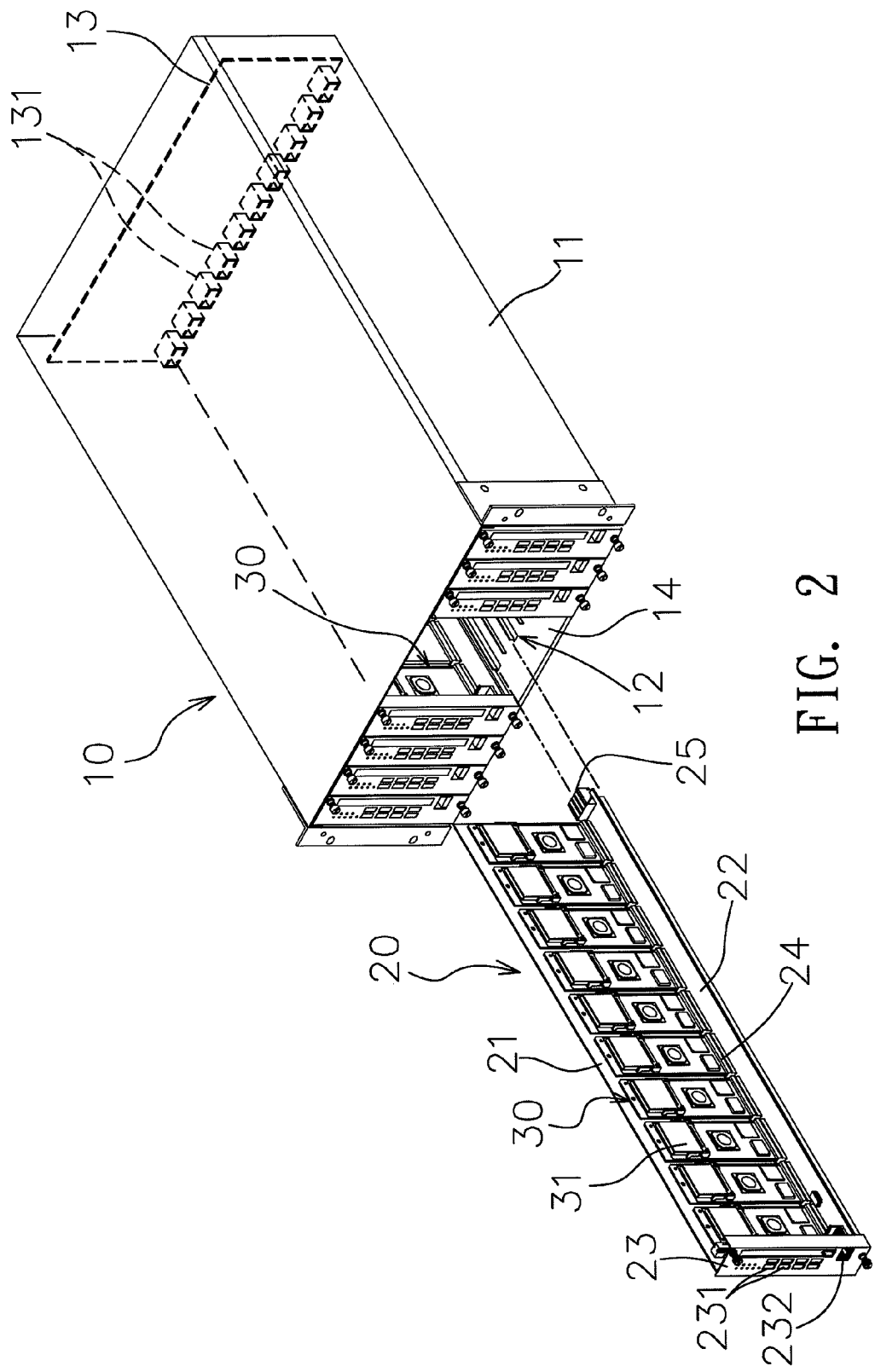
Figure 3:
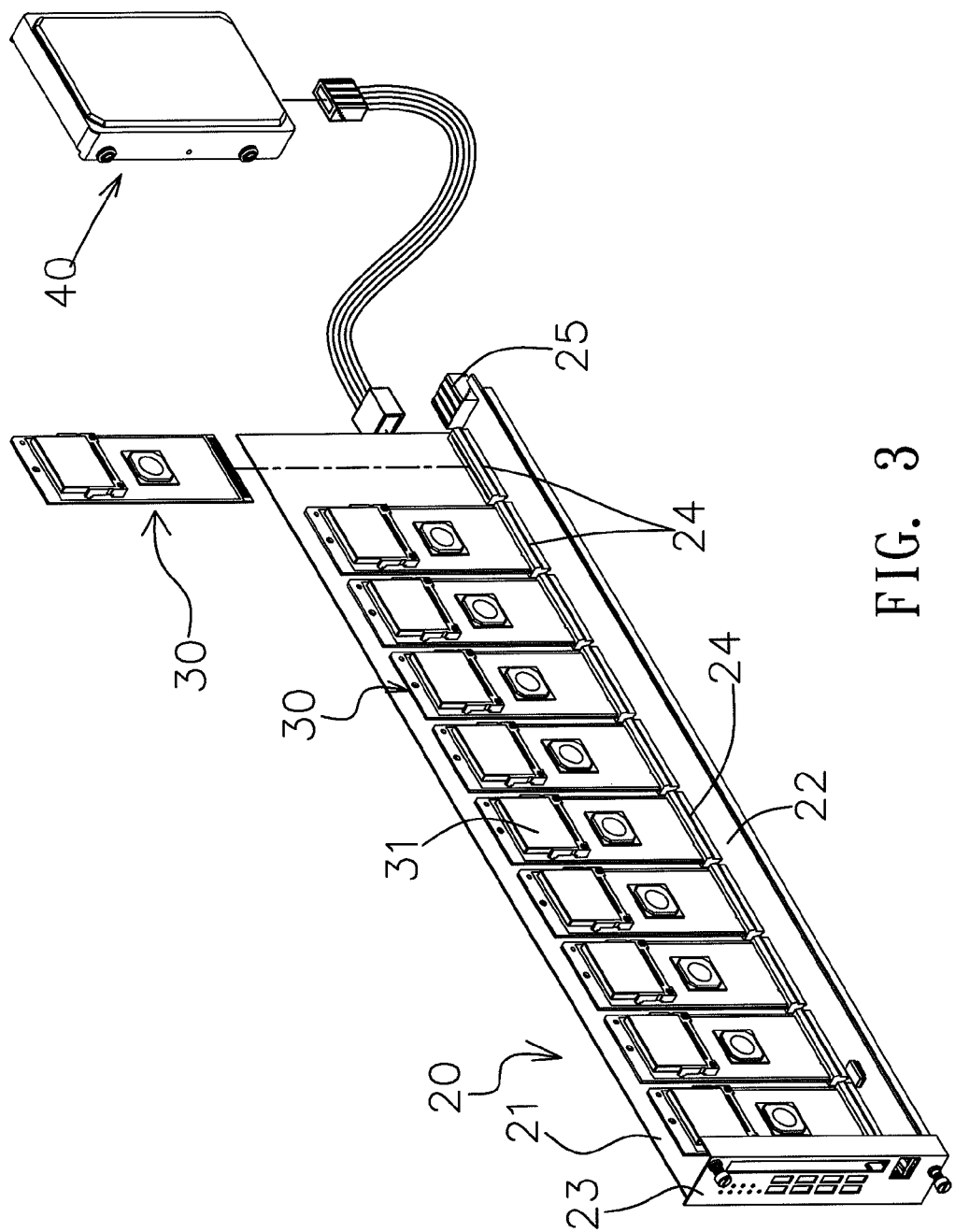
Figure 4:
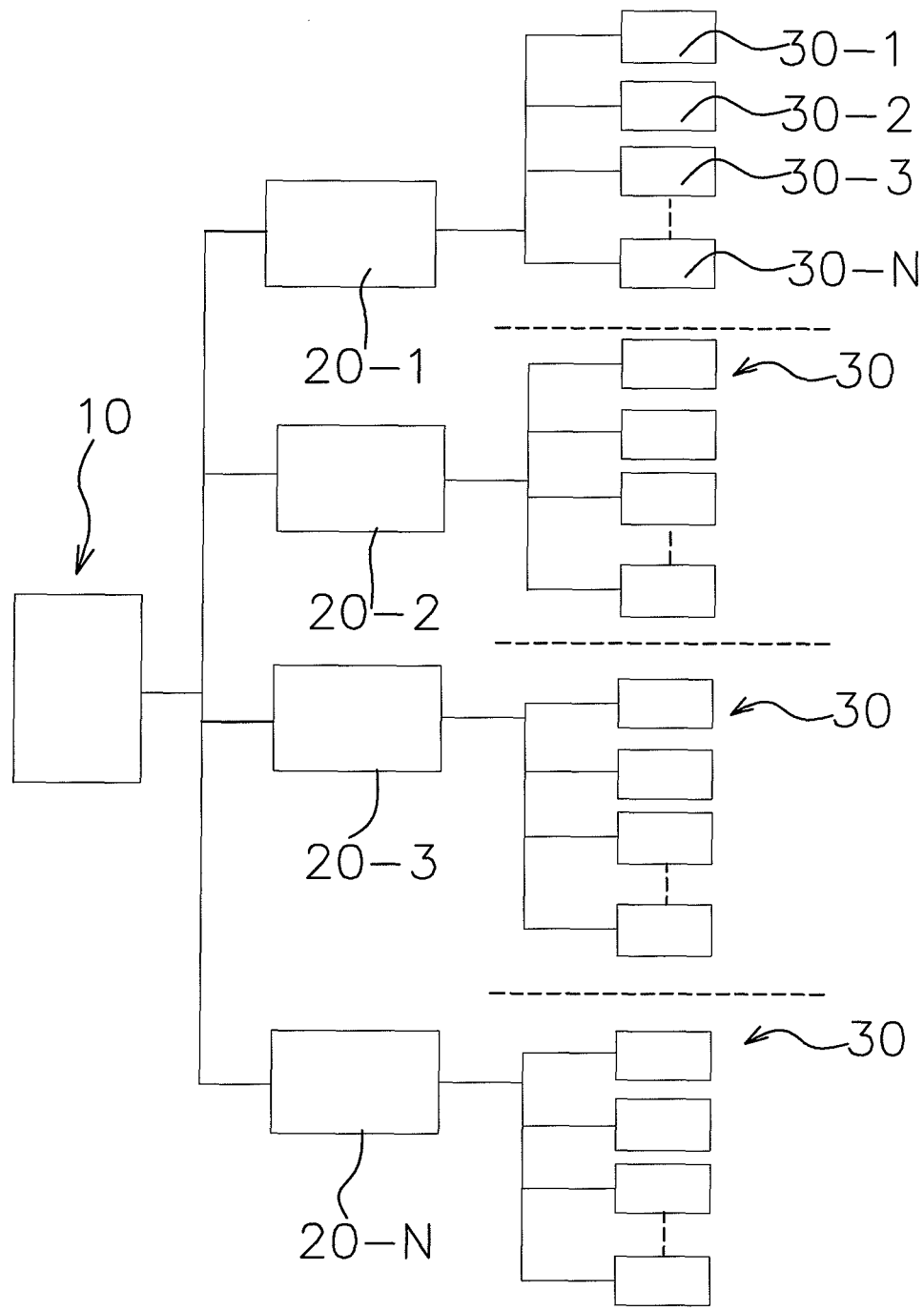
Figure 5:
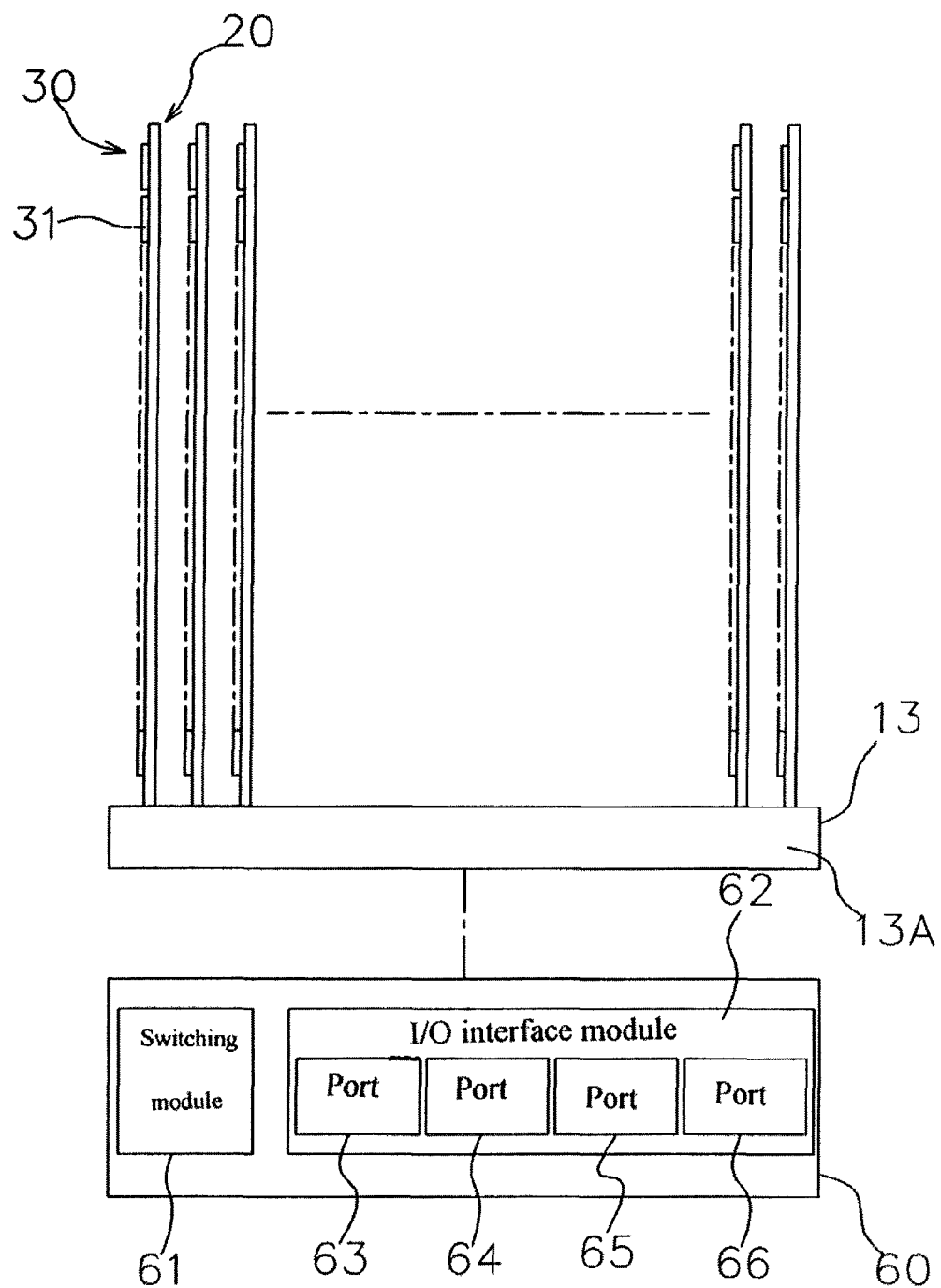

FIG. 1 is a perspective view of the present invention;
FIG. 2 is an exploded view of the present invention;
FIG. 3 is a schematic view of an expansion card module of the present invention;
FIG. 4 is a schematic view of a system architecture of the present invention; and
FIG. 5 is a schematic view of controlling a main control circuit of the present invention.

DETAILED DESCRIPTION OF THE PREFERRED EMBODIMENTS

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

With reference to FIGS. 1 to 3 for a high-density computer system in accordance with a first preferred embodiment of the present invention, the high-density computer system comprises a chassis 10, at least one expansion card module 20 and a plurality of CPU cards 30. The chassis 10 includes a casing 11, and the casing 11 includes a bottom panel 14, and the bottom panel 14 includes a containing space 12 for installing a plurality of slide rails (or other components), and the chassis 10 further includes a main backplane 13 installed at the rear of the chassis 10, and the main backplane 13 includes a main control circuit installed thereon, and the main backplane 13 includes a plurality of main backplane slots 131 opposite to the containing space 12, and the main control circuit and the main backplane slots 131 are used for transmitting data signals through a primary I/O bus (not shown in the figure) on the main backplane 13.

The expansion card module 20 is inserted and installed into the containing space 12 of the casing 11, and the expansion card module 20 includes a sub-backplane 21, and the sub-backplane 21 includes a sub-control circuit and a plurality of second sub-backplane slots 24 thereon, and the sub-backplane 21 is fixed into a position by a lower panel 22 and a front panel 23, and the rear end of the sub-backplane 21 has a first sub-backplane slot 25, such that when the expansion card module 20 is inserted into the containing space 12, the first sub-backplane slot 25 is aligned and positioned opposite to the corresponding main backplane slot 131, such that the sub-backplane 21 and main backplane 13 are electrically coupled. In other words, the sub-control circuit and the second sub-backplane slots 24 can be used for transmitting/receiving data signals through the first sub-backplane slot 25 and the main backplane 13. The front panel 23 includes a plurality of display windows 231 and electric slots 232 electrically coupled to the sub-control circuit. In another preferred embodiment, the sub-backplane 21 can be installed at the position of the lower panel 22 instead. In other words, the positions of the sub-backplane 21 and the lower panel 22 are switched.

The CPU card 30 is installed on the expansion card module 20, and the CPU card 30 includes a CPU 31, and an end of the CPU card 30 has a conductive terminal (such as a goldfinger) provided for inserting into the second sub-backplane slot 24 of the sub-backplane 21, such that the CPU card 30 and the sub-backplane 21 are electrically coupled. The CPU card 30 can be an independent computing system, or a plurality of CPU cards 30 allocated for executing an integrated computing system.

With reference to FIG. 3, the expansion card module 20 further includes at least one data storage device 40, such as a hard disk (HDD) installed and electrically coupled to the expansion card module 20 and serves as a data accessing device of the CPU cards 30.

As described above, the computer system of the present invention utilizes the plurality of second sub-backplane slots 24 of the sub-backplane 21 formed on each expansion card module 20, and further upgrades with a plurality of CPU cards 30, such that the computer system can increase the number of installed CPUs 31 to achieve the real-time multitasking function, and achieve the effects of improving the computing functions and making an upgrade or adjustment quickly to meet the economic benefits in compliance with the user requirements.

With reference to FIG. 4 for the system architecture of the present invention, the chassis 10 includes a plurality of expansion card modules 20 (including 20-1, 20-2, . . . 20-N) installed in the chassis 10 to constitute a computer system, and each expansion card module 20 (including 20-1, 20-2, . . . 20-N) further includes a plurality of CPU cards 30 (including 30-1, 30-2, . . . 30-N) for producing the high-density computer system of the present invention and achieving the effect of increasing the number of installed CPUs 31 of the computer system to produce a high-density module.

With reference to FIG. 5 for the high-density computer system of the present invention, the main control circuit 13A of the main backplane 13 of the computer system includes a monitoring module 60 for selectively and electrically coupling the CPU card 30 to read information of the CPU 31, and the monitoring module 60 further includes a switching module 61 and an I/O interface module 62, and the switching module 61 is provided for selectively and electrically coupling the data storage device 40 to one of the CPU cards 30 to access data. For example, the switching module 61 can select one or more CPU cards 30 as a server to read and write data. The I/O interface module 62 includes at least one port 63 for inserting and installing an external device to transmit control data to the port or receive monitoring data from the port, and the I/O interface module 62 further includes a keyboard port 64, a video port 65 or a mouse port 66 for monitoring a switch such as the keyboard-video-mouse (KVM) switch.

With the aforementioned assembly, the application of the high-density computer system of the present invention has the following advantages:

1. If it is necessary to add a function (such as a storage, wireless, encryption/decryption, 3D image and other computer and Internet applications and other related modules) at a client end, only the desired upgrading CPU card 30 (or CPU) is replaced, without replacing all of them.

2. The CPU card 30 (or CPU) of various different grades can be selected according to customer requirements.

3. Different modules (such as the wireless module, storage module and other related modules of computer and Internet applications) can be selected according to customer requirements, thus improving the expandability of the products.

4. The computer system can be shared.

In summation of the description above, the present invention complies with the patent application requirements, and is thus duly filed for patent application. While the invention has been described with reference to a preferred embodiment thereof, it is to be understood that modifications or variations may be easily made without departing from the spirit of this invention, which is defined in the appended claims.

What is claimed is:

1. A high-density computer system, comprising:
   a chassis, having a plurality of containing spaces, a main backplane installed in the chassis, and a main control circuit and a plurality of main backplane slots installed and formed on the main backplane respectively;
   at least one expansion card module, inserted into the containing space, and including a sub-backplane fixed into a position by a lower panel and a front panel, and the sub-backplane further including a sub-control circuit and a plurality of second sub-backplane slots, wherein the second sub-backplane slots are disposed and formed on the lower panel horizontally and the front panel includes at least one display window electrically coupled to the sub-control circuit; and a first sub-backplane slot formed at an end corner of the sub-backplane on the lower panel and corresponding to the main backplane slot; and
   a plurality of CPU cards, installed onto the expansion card module, and inserted vertically and correspondingly coupled to the second sub-backplane slots respectively, and a CPU is installed on each CPU card;
   wherein the at least one expansion card module slides into the containing space by the lower panel through a rail located on a bottom wall of the chassis.

2. The high-density computer system of claim 1, wherein the CPU card or the CPU is an independent computing system.

3. The high-density computer system of claim 1, wherein the CPU cards or the CPUs are allocated for executing an integrated computing system.

4. The high-density computer system of claim 1, wherein the CPU card includes a conductive terminal or a goldfinger disposed at an end of the CPU card and electrically coupled to the second sub-backplane slot.

5. The high-density computer system of claim 1, wherein the expansion card module further includes a data storage device electrically coupled to the second sub-backplane slot.

6. The high-density computer system of claim 1, further comprising a monitoring module for selectively and electrically coupling the CPU card to read information of the CPU.

7. The high-density computer system of claim 6, wherein the monitoring module further comprises an I/O interface module, and the I/O interface module includes at least one port provided for installing and inserting an external device and transmitting control data to the port or receive monitoring data from the port.

8. The high-density computer system of claim 7, wherein the I/O interface module includes a keyboard port, a video port or a mouse port.

* * * * *